(12) United States Patent
Bower et al.

(10) Patent No.: US 9,051,493 B2
(45) Date of Patent: Jun. 9, 2015

(54) METHOD AND APPARATUS FOR JOINING TOGETHER MULTIPLE FUNCTIONAL LAYERS OF A FLEXIBLE DISPLAY

(71) Applicant: Nokia Technologies Oy, Espoo (FI)

(72) Inventors: Chris Bower, Ely (GB); Mark Allen, Cambridge (GB); Darryl Cotton, Cambridgeshire (GB); Piers Andrew, Cambridgeshire (GB)

(73) Assignee: Nokia Technologies Oy, Espoo (FI)

( * ) Notice: Subject to any disclaimer, the term of this patent is extended or adjusted under 35 U.S.C. 154(b) by 59 days.

(21) Appl. No.: 13/852,511

(22) Filed: Mar. 28, 2013

(65) Prior Publication Data

US 2014/0295150 A1  Oct. 2, 2014

(51) Int. Cl.
  *B32B 3/00* (2006.01)
  *C09J 7/02* (2006.01)
  *B32B 7/12* (2006.01)
  *C09J 5/00* (2006.01)
  *C09J 7/00* (2006.01)

(52) U.S. Cl.
  CPC ............ *C09J 7/02* (2013.01); *Y10T 428/24851* (2015.01); *B32B 7/12* (2013.01); *C09J 5/00* (2013.01); *C09J 7/00* (2013.01); *C09J 2201/40* (2013.01); *C09J 2203/318* (2013.01); *C09J 2205/31* (2013.01)

(58) Field of Classification Search
  CPC .................. C09J 5/06; C09J 7/02; B32B 7/02
  See application file for complete search history.

(56) References Cited

U.S. PATENT DOCUMENTS

2009/0162645 A1  6/2009  Matsuhira
2012/0154707 A1  6/2012  Hsieh et al.

FOREIGN PATENT DOCUMENTS

WO    WO 2012/138675 A1    10/2012

OTHER PUBLICATIONS

International Search Report and Written Opinion for Application No. PCT/FI2014/050104 dated May 19, 2014.

*Primary Examiner* — Elizabeth Mulvaney
(74) *Attorney, Agent, or Firm* — Alston & Bird LLP

(57) ABSTRACT

The present invention may relate to provision of a mechanism to join together the various substrate layers of a flexible display with optically clear adhesives that permit improved flexibility of the substrate layer stack and may also optically guide images to locations on a display surface that are not aligned with the display layer of a substrate layer stack. Embodiments of the present invention may provide for an improved user interface which may include enhanced flexibility and enhanced optical characteristics.

20 Claims, 8 Drawing Sheets

METHOD AND APPARATUS FOR JOINING TOGETHER MULTIPLE FUNCTIONAL LAYERS OF A FLEXIBLE DISPLAY

TECHNOLOGICAL FIELD

Some example embodiments of the present invention relate generally to the joining of multiple layers of a display of a device with an optically clear adhesive, and more particularly, to the joining of multiple layers of a flexible display with an optically clear adhesive that affords greater flexibility at specific locations of the display.

BACKGROUND

In recent years, considerable progress has been made toward the development of thin and flexible displays. For example, it is known to have a display device assembly including a flexible display device being rollable around an axis. A range of flexible electronic devices based on these technologies including full color, high-resolution flexible organic light emitting diode, OLED, displays with a thickness of less than one millimeter are being introduced to the market. The goal of such efforts is to provide displays with superior handling, contrast, and flexibility.

While conventional displays have been made of layers of rigid materials, such as glass and hard polymers, flexible displays employ layers of flexible materials such as thin films. The flexibility may add durability to the display and may increase functionality through additional user input mechanisms. However, the flexibility of such flexible displays is limited, at least in part, by the materials used to create the displays and the movement between the various layers of the display during flexing.

BRIEF SUMMARY

A method and apparatus are provided to enable improved flexibility of a flexible display by using materials specifically configured to enhance the flexibility of the display, particularly at areas in which the greatest degree of flexing may occur.

An example embodiment may provide a method including depositing a layer of optically clear adhesive on a first substrate, and laminating a second substrate to the optically clear adhesive opposite the first substrate. The optically clear adhesive may include a first region of a first elastic modulus and a second region of a second elastic modulus, where the second elastic modulus is different than the first elastic modulus. The optically clear adhesive may include a liquid optically clear adhesive, or the optically clear adhesive may be a thin film. The method may include cross-linking the optically clear adhesive of the first region to a first degree and cross-linking the optically clear adhesive of the second region to a second degree, which is different than the first degree. The cross-linking of the optically clear adhesive may be performed by exposure to ultraviolet radiation, and the second region of the optically clear adhesive may be shielded from at least a portion of the ultraviolet radiation. The cross-linking of the optically clear adhesive may optionally be performed by the application of heat, or a chemical cross-linking agent. Depositing a layer of optically clear adhesive may include printing a pattern of a first optically clear adhesive to form the first region of the optically clear adhesive. Depositing a layer of optically clear adhesive may further include printing a second pattern of a second optically clear adhesive to form the second region of the optically clear adhesive. The second elastic modulus may be lower than the first elastic modulus, and the second region of the optically clear adhesive may define a region of increased flexibility.

Embodiments of the present invention may provide an apparatus that includes a display stack. The display stack may include a first substrate, a layer of optically clear adhesive deposited on the first substrate, and a second substrate. The layer of optically clear adhesive may define a first region with a first elastic modulus and a second region with a second elastic modulus, where the first elastic modulus is different than the second elastic modulus. The second elastic modulus may be lower than the first elastic modulus, and the second region of the optically clear adhesive may define a region of the display stack with greater flexibility than a region of the display stack defined by the first region of the optically clear adhesive. The optically clear adhesive may include a liquid optically clear adhesive. The liquid optically clear adhesive may be cross-linked to a first degree in the first region, and cross-linked to a second degree that is different from the first degree in the second region. The first region of optically clear adhesive may be cured in response to exposure to ultraviolet radiation.

Embodiments of the present invention may provide for a display stack including a first substrate, a layer of optically clear adhesive deposited on the first substrate, and a second substrate. The layer of optically clear adhesive may define a first patterned region with a first refractive index. The layer of optically clear adhesive may define a second patterned region including a second refractive index. The first refractive index may be different than the second refractive index; however, the first refractive index may also be the same as the second refractive index. The first patterned region and the second patterned region may include the same optically clear adhesive and where the first patterned region may be cured to a first degree and where the second patterned region may be cured to a second degree, different than the first degree. The first patterned region may be cured by exposure to ultraviolet radiation. The first patterned region and the second patterned region may each include a different optically clear adhesive. The first patterned region may be printed to the first substrate.

BRIEF DESCRIPTION OF THE SEVERAL VIEWS OF THE DRAWING(S)

Having thus described embodiments of the invention in general terms, reference will now be made to the accompanying drawings, which are not necessarily drawn to scale, and wherein:

FIG. 1 is a schematic block diagram of a mobile terminal which may benefit from example embodiments of the present invention;

FIGS. 2A, 2B, and 2C illustrate a display stack with a selectively patterned optically clear adhesive according to an example embodiment of the present invention;

DETAILED DESCRIPTION

Figure 1:
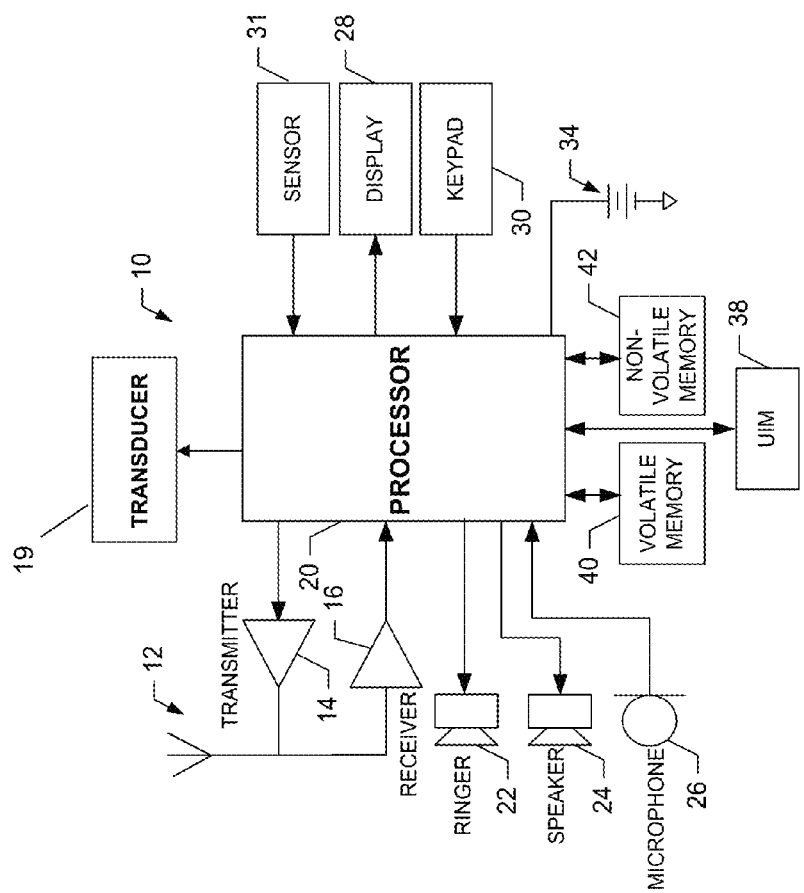

Some embodiments of the present invention will now be described more fully hereinafter with reference to the accompanying drawings, in which some, but not all embodiments of the invention are shown. Indeed, various embodiments of the invention may be embodied in many different forms and should not be construed as limited to the embodiments set forth herein; rather, these embodiments are provided so that this disclosure will satisfy applicable legal requirements. Like reference numerals refer to like elements throughout. As used herein, the terms "data," "content," "information" and similar terms may be used interchangeably to refer to data capable of being transmitted, received and/or stored in accordance with some embodiments of the present invention. Thus, use of any such terms should not be taken to limit the spirit and scope of embodiments of the present invention.

Additionally, as used herein, the term 'circuitry' refers to (a) hardware-only circuit implementations (e.g., implementations in analog circuitry and/or digital circuitry); (b) combinations of circuits and computer program product(s) comprising software and/or firmware instructions stored on one or more computer readable memories that work together to cause an apparatus to perform one or more functions described herein; and (c) circuits, such as, for example, a microprocessor(s) or a portion of a microprocessor(s), that require software or firmware for operation even if the software or firmware is not physically present. This definition of 'circuitry' applies to all uses of this term herein, including in any claims. As a further example, as used herein, the term 'circuitry' also includes an implementation comprising one or more processors and/or portion(s) thereof and accompanying software and/or firmware. As another example, the term 'circuitry' as used herein also includes, for example, a baseband integrated circuit or applications processor integrated circuit for a mobile phone or a similar integrated circuit in a server, a cellular network device, other network device, and/or other computing device.

Some embodiments of the present invention may relate to provision of a mechanism to join together the various substrate layers of a flexible display with optically clear adhesives that permit improved flexibility of the substrate layer stack and may also optically guide images to locations on a display surface that are not aligned with the display layer of a substrate layer stack. Embodiments of the present invention may provide for an improved user interface which may include enhanced flexibility and enhanced optical characteristics.

FIG. 1 illustrates a block diagram of a mobile terminal 10 that may benefit from embodiments of the present invention. It should be understood, however, that the mobile terminal 10 as illustrated and hereinafter described is merely illustrative of one type of device that may benefit from embodiments of the present invention and, therefore, should not be taken to limit the scope of embodiments of the present invention. As such, although numerous types of mobile terminals, such as portable digital assistants (PDAs), mobile telephones, pagers, mobile televisions, gaming devices, laptop computers, cameras, tablet computers, touch surfaces, wearable devices, video recorders, audio/video players, radios, electronic books, positioning devices (e.g., global positioning system (GPS) devices), or any combination of the aforementioned, and other types of voice and text communications systems, may readily employ embodiments of the present invention, other devices including fixed (non-mobile) electronic devices may also employ some example embodiments.

The mobile terminal 10 may include an antenna 12 (or multiple antennas) in operable communication with a transmitter 14 and a receiver 16. The mobile terminal 10 may further include an apparatus, such as a processor 20 or other processing device (e.g., processor 70 of FIG. 2), which controls the provision of signals to and the receipt of signals from the transmitter 14 and receiver 16, respectively. The signals may include signaling information in accordance with the air interface standard of the applicable cellular system, and also user speech, received data and/or user generated data. In this regard, the mobile terminal 10 is capable of operating with one or more air interface standards, communication protocols, modulation types, and access types. By way of illustration, the mobile terminal 10 is capable of operating in accordance with any of a number of first, second, third and/or fourth-generation communication protocols or the like. For example, the mobile terminal 10 may be capable of operating in accordance with second-generation (2G) wireless communication protocols IS-136 (time division multiple access (TDMA)), GSM (global system for mobile communication), and IS-95 (code division multiple access (CDMA)), or with third-generation (3G) wireless communication protocols, such as Universal Mobile Telecommunications System (UMTS), CDMA2000, wideband CDMA (WCDMA) and time division-synchronous CDMA (TD-SCDMA), with 3.9G wireless communication protocol such as evolved UMTS Terrestrial Radio Access Network (E-UTRAN), with fourth-generation (4G) wireless communication protocols (e.g., Long Term Evolution (LTE) or LTE-Advanced (LTE-A) or the like. As an alternative (or additionally), the mobile terminal 10 may be capable of operating in accordance with non-cellular communication mechanisms. For example, the mobile terminal 10 may be capable of communication in a wireless local area network (WLAN) or other communication networks.

In some embodiments, the processor 20 may include circuitry desirable for implementing audio and logic functions of the mobile terminal 10. For example, the processor 20 may be comprised of a digital signal processor device, a microprocessor device, and various analog to digital converters, digital to analog converters, and other support circuits. Control and signal processing functions of the mobile terminal 10 are allocated between these devices according to their respective capabilities. The processor 20 thus may also include the functionality to convolutionally encode and interleave message and data prior to modulation and transmission. The processor 20 may additionally include an internal voice coder, and may include an internal data modem. Further, the processor 20 may include functionality to operate one or more software programs, which may be stored in memory. For example, the processor 20 may be capable of operating a connectivity program, such as a conventional Web browser. The connectivity program may then allow the mobile terminal 10 to transmit and receive Web content, such as location-based content and/or other web page content, according to a Wireless Application Protocol (WAP), Hypertext Transfer Protocol (HTTP) and/or the like, for example.

The mobile terminal 10 may also comprise a user interface including an output device such as a conventional earphone or speaker 24, a ringer 22, a microphone 26, a display 28, and a user input interface, all of which are coupled to the processor 20. The user input interface, which allows the mobile terminal 10 to receive data, may include any of a number of devices allowing the mobile terminal 10 to receive data, such as a keypad 30, a touch display (display 28 providing an example of such a touch display) or other input device. In embodiments including the keypad 30, the keypad 30 may include the conventional numeric (0-9) and related keys (#, *), and other hard and soft keys used for operating the mobile terminal 10. Alternatively or additionally, the keypad 30 may include a conventional QWERTY keypad arrangement. The keypad 30 may also include various soft keys with associated functions. In addition, or alternatively, the mobile terminal 10 may include an interface device such as a joystick or other user input interface. Some embodiments employing a touch display may omit the keypad 30 and any or all of the speaker 24, ringer 22, and microphone 26 entirely. Embodiments of the mobile terminal may further include a transducer 19, for example, as part of the user interface. The transducer 19 may be a haptic transducer for providing haptic feedback to a user. The haptic feedback may be provided in response to inputs received by the user or by the mobile terminal for providing tactile notification to a user.

Displays of mobile devices, such as display 28 of mobile terminal 10 may use multi-layered displays to enable the functionality of the display. For example, a touch screen display may include a transparent surface layer, one or more transparent conductive layers (e.g., to enable touch input), a glass layer to provide rigidity, and a light-emitting diode (LED), organic light-emitting diode (OLED), or liquid crystal display (LCD) layer. Various displays (e.g. Polymer Dispersed Liquid Crystal (PDLC) or other reflective LCD display, ElectroPhoretic (EP), Electroluminescent (EL), Electrowetting (EW) Electrochromic (EC), or other optical modulation effects such as Interference based on frustrated internal reflection or Fabry Perot cavities.) will be configured with various substrate layers, including or omitting layers noted above and various other substrate layers which may provide additional durability, functionality, etc. However, in each case the layers need to be joined to one another, such as through adhesives, to provide a clear and usable display. Optically clear adhesives (OCAs) are commonly used for joining together multiple functional layers in an electronic device that includes an electronic display. The OCA provides a means for joining components such as a display window, touch screen, polarizer and display (e.g., an LCD display) together to form the final display stack which may then be integrated into the device. OCAs must provide sufficient adhesion and transparency to ensure that the display stack is robust enough to withstand prolonged use and environmental conditions, particularly when the display stack has a touch screen that is frequently used for interaction with the device.

While conventional displays are substantially rigid and include a glass or other substrate, recent developments have enabled the production of flexible displays which may have additional benefits. Flexible displays may enable an additional level of interactivity and additional form factors for electronic devices. For example, a 'kinetic device' may use a flexible organic light emitting diode (OLED) display that can be bent and twisted to make selections, zoom images, etc. Such flexible devices may have much more demanding requirements for the OCA material used to bond the display stack substrates together since the OCA and the layers of the display stack will be subjected to greater stresses and strain relative to a conventional rigid stack. In an example embodiment of a folding display, the display stack and OCAs will be subject to extremes of stress and strain along the fold line since the radius of curvature may be relatively small.

In an example embodiment of a flexible electronic device, the display stack may contain several layers including the display, touch screen, and display window, all of which may need to be bonded together with sufficient adhesion and transparency to allow for touch interaction with the device, and also twist and bend interactions. This bonding may be achieved by the use of an OCA material in the form of a thin film that adheres to the adjacent layers on application of heat, pressure, UV radiation, chemical curing, or some combination of these during the lamination process. To allow for extreme deformation (e.g., folding), the OCA material must be able to allow for a considerable amount of slip between various component layers and provide some strain relief between, for instance, the display and the touch screen or the display and the display window. At the same time, the OCA material must also provide adhesion between the functional layers.

Provided herein is a method to implement an OCA layer which has selectively patterned regions of different elastic moduli and refractive indices allowing for positioning the neutral axis of laminated films and for creating visual display effects. Example embodiments in which the OCA layer includes regions of different elastic moduli may control the stresses in the fold line of a flexible display. The use of selective patterning and curing steps may allow for the creation of an adhesive joining layer that can have regions which are stiff, well adhered, provide rigidity, robustness, and prevent sagging of the substrates, and regions which have a much lower elastic modulus or which would remain liquid and allow for large shear strain and significant bending without generating significant stresses and without delaminating substrate layers from one another.

Figure 2:
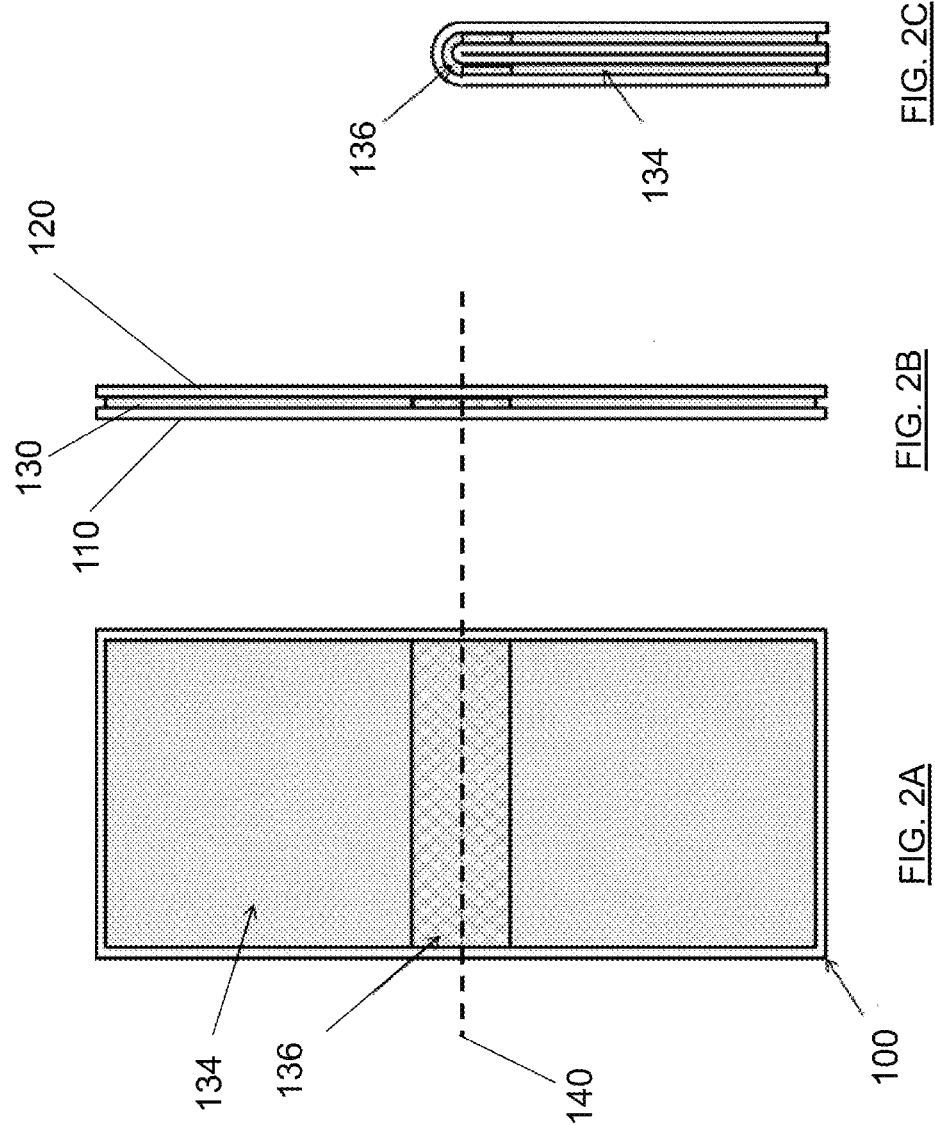

FIG. 2 illustrates selectively patterned OCA structure that may allow for minimum strain transfer along a fold line. A frontal view of a layered stack display 100 is illustrated in FIG. 2A, while FIG. 2B illustrates a profile view of the same layered stack display 100. The layered stack is simplified to include only two substrate layers; however, embodiments may include a plurality of layers, each joined through a patterned OCA structure. The first substrate layer 110 is separated from the second substrate layer 120 by a layer of OCA 130. The OCA 130 may include a region of low elastic modulus OCA 136 and a region of higher elastic modulus OCA 134 which is more rigid than the region of low elastic modulus. The regions may be selectively patterned with the region of low elastic modulus OCA 136 disposed proximate a fold line 140 about which the layered stack display 100 may be bent or folded. FIG. 2C illustrates the display stack 100 folded about the fold line 140 such that the low elastic modulus OCA is flexed while the higher elastic modulus OCA 134 remains un-flexed. The OCA disposed between the substrate layers experiences high shear forces proximate the bend/fold as the substrate layers move relative to one another, while the OCA 134 disposed between the substrate layers where they remain un-flexed does not experience the same shear forces.

Described herein are several methods of creating a patterned OCA material. While the methods described herein may relate to joining two substrates together, as will be apparent to one of ordinary skill in the art, joining methods may be duplicated or combined with other joining methods to join additional layers together to form a complete display stack. Therefore, examples provided herein are understood to be replicable over a plurality of layers as necessary.

Figure 3:
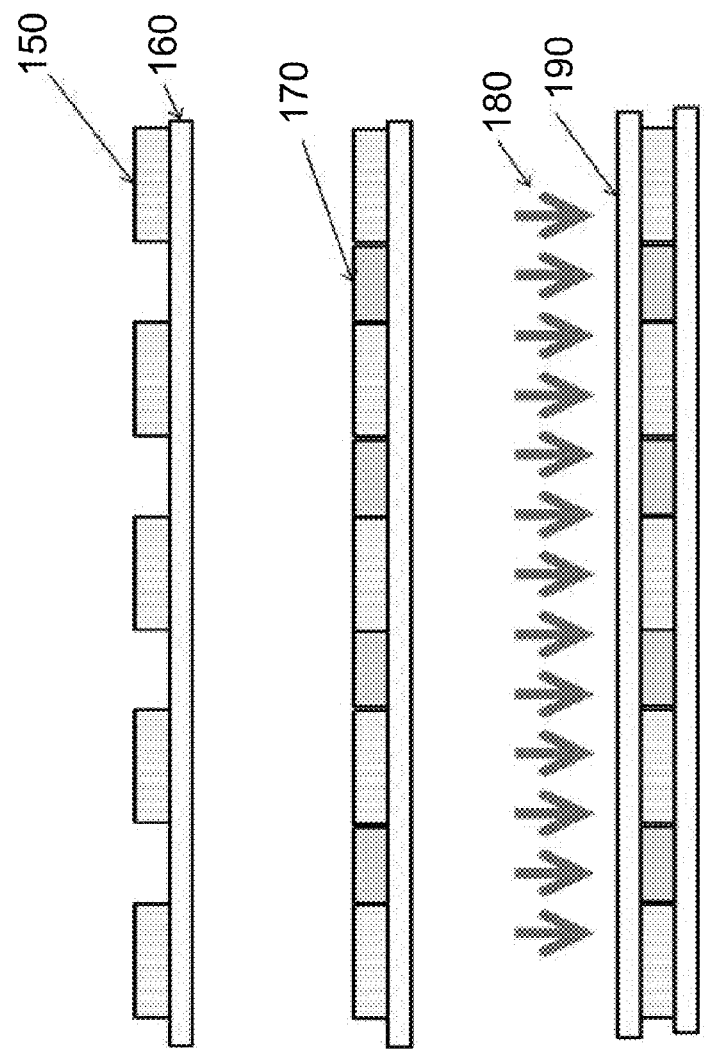
FIG. 3 illustrates an example embodiment of patterned deposition of liquid optically clear adhesive according to the present invention.

A first example embodiment may include using selective printing of a liquid optically clear adhesive (LOCA) to create patterned regions of OCA on one or both substrates that are to be joined. The LOCA can be cured or partially cured using heat and/or ultraviolet (UV) radiation exposure and/or chemical crosslinking. Two different LOCA materials having different elastic moduli when cured may be printed sequentially to create an adhesive layer that has patterned regions of different stiffness as shown in FIG. 3. A substrate 160 may be selectively patterned with LOCA 150 having an elastic modulus X when cured. The uncoated regions of the substrate may, in some embodiments, be left bare to create air gaps. Alternatively, the uncoated regions may be patterned with another LOCA 170 having an elastic modulus Y. The second substrate 190 may be laminated on top of the LOCA 150, 170. The lamination may occur under vacuum to remove air bubbles. The stack may then be uniformly exposed to UV (and/or heat) 180 to cure the LOCA and bond the two substrates together. The result is an OCA layer that has regions of different elastic modulus.

Depending upon the patterning method used to deposit the two types of LOCA, variations on this fundamental approach may be used. For example, it may be difficult to stencil print a second wet layer in between the regions of a first wet layer without disrupting the first wet layer of LOCA since the stencil may be required to be in close contact with the printed layer to achieve adequate material transfer through the stencil onto the substrate. A thick metal stencil may be used, where pockets have been etched on the underside to allow the stencil to be brought into contact with the substrate without disrupting the first wet layer of LOCA. If the second printed LOCA has adequately low viscosity and sufficient wetting on the substrate, the second printed layer of LOCA will spread on the substrate to completely fill the gaps left by the first LOCA. The same issue may arise with screen printing as the squeegee blade of a screen printing apparatus may force the screen into contact with the existing first wet layer of LOCA. Using an inkjet printer or valve jet printer or spray to deposit the second wet layer between the first wet layer may avoid this issue. Alternatively the first OCA layer may be a dry thin film adhesive that can have certain areas removed either before or after lamination to create the desired pattern, the second LOCA layer can then be printed or coated into the gaps in the first layer.

Another alternative for printing the second layer may be to perform the lamination of the second substrate after patterning the first LOCA material, expose the substrate to UV radiation or heat to cure, then backfill the air gaps with the second LOCA material. Such a method may be performed under vacuum using methods similar to those used to fill LCD displays with the liquid crystal solution. The empty cavity may be placed in the LOCA material and a vacuum may be applied. On release of the vacuum, the LOCA may fill the gaps. Screen or stencil printing may be used for patterning the first LOCA material, and this method may provide sharp boundaries between the two different cured OCA materials since no diffusion or mixing can occur, as may happen when the LOCA materials are printed in close proximity when wet. The second LOCA may be cured if necessary.

According to some example embodiments, only a single patterned LOCA layer may be deposited between the two substrates to be joined, and air-gaps may be left between the printed features to allow for minimal stress transfer when the stack undergoes extreme strain, such as folding. In other embodiments, a refractive index matching liquid may be used to fill the air gaps after the lamination step which may minimize stress transfer, but may also avoid any unwanted optical (for example, scattering or diffractive) effects that may occur due to the large change in refractive index between a cured OCA and an air gap.

Further embodiments may include pre-patterned substrates to include elevated banks/walls such that the first LOCA and the second LOCA material can be printed in separate areas to prevent or reduce their mixing before the curing. For example, plastics may include embossing micro-replication or nano-imprint, flexible glass may include printing and curing of narrow boundary areas which can be performed as described above.

Another example embodiment of the present invention may include selective curing of a uniform LOCA film to create patterned regions of different elastic modulus. In such an embodiment, an LOCA may first be spread to form a wet film of uniform thickness using a thin film coating technique such as slot-die coating, bar-coating, rod-coating, knife coating, or the like. The substrates to be joined may then be laminated together under vacuum to remove any unwanted air bubbles. For UV radiation curable LOCA, UV radiation exposure may be performed through a shadow mask having the desired pattern such that some regions of the LOCA receive a higher UV exposure and become cross-linked to a greater degree than other, less exposed regions. The regions with a greater-degree of cross-linking may have a higher elastic modulus than regions which have lower cross-link density.

Optionally, a heat curing positive photoresist LOCA can be used with a photo inhibitor. In such an embodiment, the regions of OCA exposed to UV radiation and heat curing may have been photo softened with respect to the unexposed regions. An advantage of such an embodiment may include that the cross-linker and base monomer are combined with a photo-inhibitor which makes them resistant to further curing. Using a shadow mask allows for a rapid, selective exposure of the entire sample, but there may be minimal control of the exposure dosage in the masked region. Optionally, a UV point source, such as a UV LED or laser may be used to selectively write to small regions of the LOCA. While potentially more precise and providing greater control of the UV exposure in all regions of the sample, such an embodiment may take more time to perform.

Figure 4:
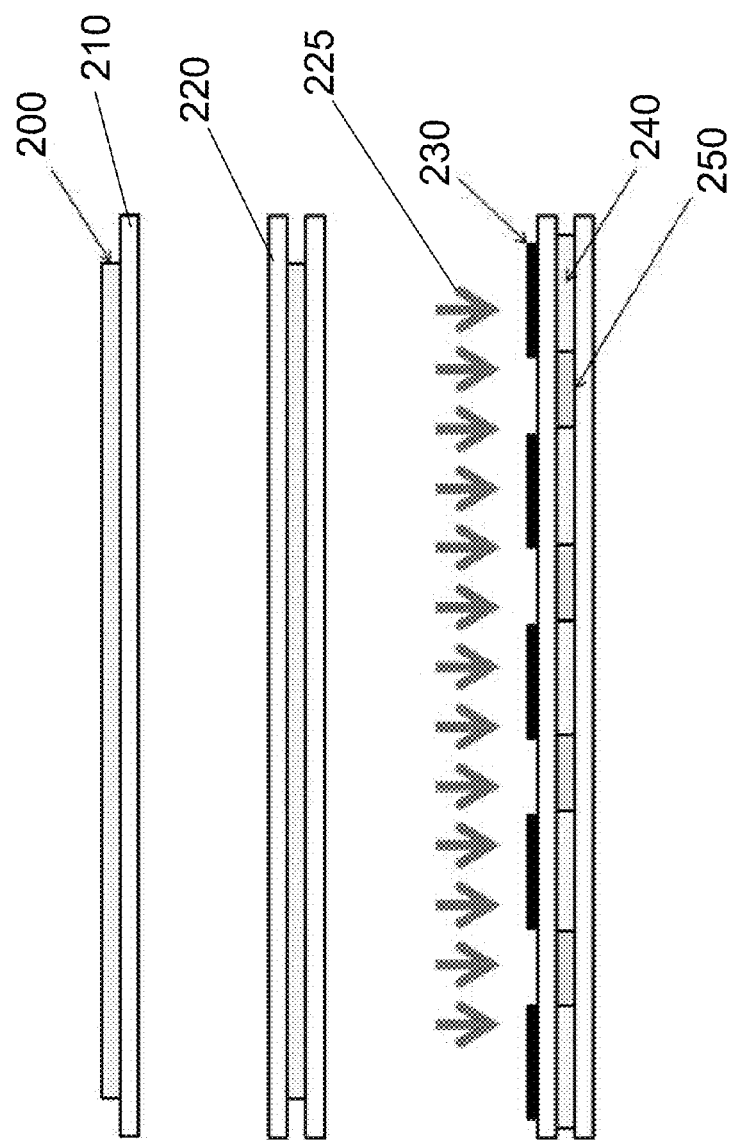
FIG. 4 illustrates an example embodiment of patterned optically clear adhesive created by selective curing of a uniform layer according to the present invention.

FIG. 4 illustrates an example embodiment of selective curing of a uniform layer. In the illustrated embodiment, a uniform layer of LOCA material 200 may be spread by a conventional thin film coating method over a first substrate layer 210. A second substrate layer 220 may be laminated on top of the LOCA material 200 under vacuum. A shadow mask 230 may be applied over the layered stack (first substrate 210, LOCA 210, and second substrate 220) and the masked stack may be exposed to heat or UV radiation 225. The exposure to heat or UV radiation creates regions with different cross-link density, depending upon whether they are masked 240 or unmasked 250 portions of the LOCA 210. The difference in cross-linking results in differing regions of elastic modulus.

Additionally or alternatively to UV curing, selective heat curing can be used in similar ways to create regions of differing elastic modulus. For instance, silicone materials such as polydimethylsioxane (PDMS) can be cross-linked to different degrees depending upon the curing temperature. After lamination of two substrates, heat may be applied using either an infrared (IR) heater and shadow mask, an IR spot curing system (e.g., a laser), or directly using a patterned heat transfer plate. The latter method being particularly useful when the substrates are not transparent to UV radiation.

Some example embodiments of LOCAs may include moisture-curable silicone LOCAs where the substrates can be selectively patterned by printing water prior to coating the LOCA. Once laminated, UV curing will only cure the LOCA areas in contact with water. The water-patterning and LOCA curing steps can be sequentially repeated to obtain better water contact throughout the desired regions.

In an example embodiment, transparent or substantially transparent, electrically or thermally conductive routing may be patterned onto the substrate or substrates prior to coating the substrate with a thermally curable LOCA. After lamination, electric current may be driven through the conductors to generate local heating and hence, localized curing of the LOCA.

Chemically cured LOCAs can also be selectively cured by patterned deposition of the cross-linking agent onto a uniform coating of the monomer material. For example, the monomer can be slot coated, bar coated, micro-gravure printed, etc., and the cross-linker can then be applied only in the desired locations by using a non-contact patterned deposition technique such as inkjet printing, spraying, or stencil printing. In this manner, the LOCA may be selectively cured in certain regions which have a high cross-link density while other regions retain little or no cross-linking, creating regions of high and low elastic modulus, and in some instances, regions of solid and liquid material.

Figure 5:
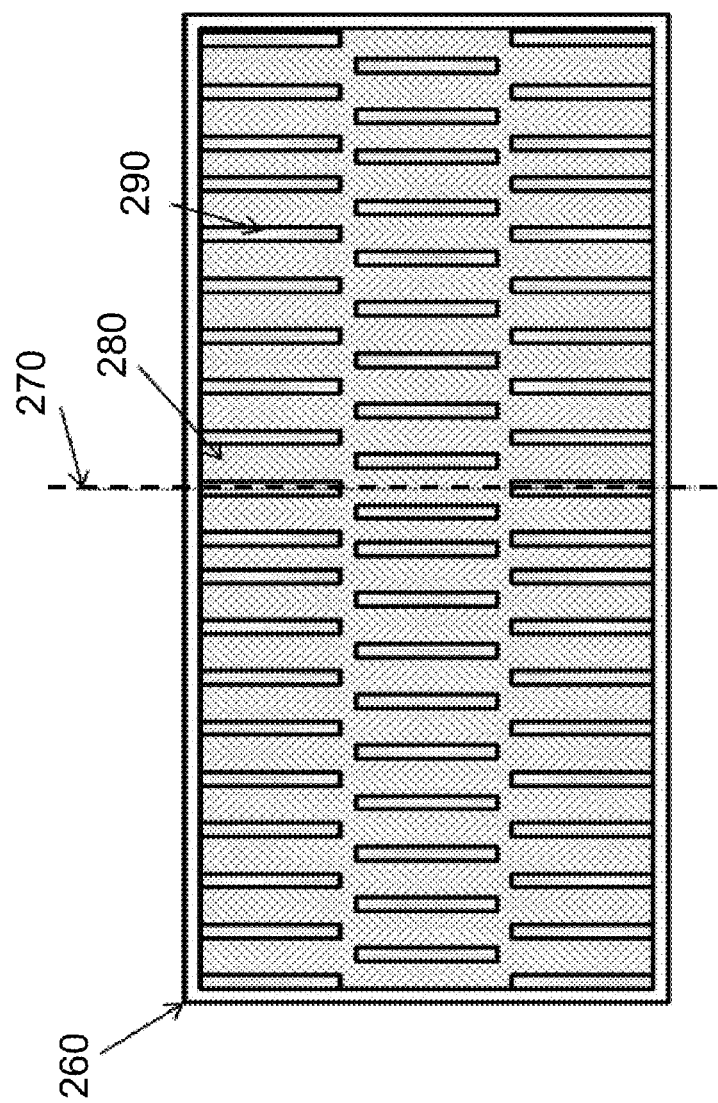
FIG. 5 illustrates an example embodiment of selectively patterned optically clear adhesive according to the present invention.

Any of the methods described above can be used to create selectively patterned OCA layers. FIG. 2 illustrates an example embodiment of a structure configured to allow extreme bending of the display stack by using regions of more compliant OCA around the fold line 140. In some cases, the regions of reduced stiffness can be air gaps, non-curing liquids, or OCA with a lower elastic modulus. FIG. 5 illustrates another example embodiment of a selectively patterned OCA to allow for stress relief at high strain when the display stack 260 is folded. In the illustrated embodiment, higher elastic modulus regions 290 are surrounded by lower elastic modulus regions 280, which may be air, a non-curing liquid, or a lower elastic modulus OCA material. A fold line 270 may illustrate a line along which the display may be folded. The higher modulus regions 290 may also be orientated at 90 degrees to the fold line to provide resistance to tight bending along the fold line.

Embodiments of the present invention may reduce stress transfer between adjacent layers of a stack of substrate layers to allow flexibility and bending of a stacked display. By altering the ratio of elastic modulus between materials, and positioning the materials between substrate layers, a neutral axis can be tuned to each layer according to the desired flexibility and the locations of desired bends. The overall stiffness of a flexible display can be significantly reduced by making the display stack easier to bend with lower forces by virtue of the strategic positioning of low elastic modulus OCA between layers. Low modulus OCA can be patterned to enable a more desirable distribution of stress across the display or a portion thereof.

In addition to creating regions of different elastic modulus, the above methods can be used to create regions having different refractive indices, which can be used to selectively guide light depending upon the geometry and orientation of the different regions. According to some embodiments of the present invention, selective curing of the OCA layer immediately above the display layer (e.g., immediately above an OLED display layer), can be used to create a light-guiding adhesive layer that allows light emitted from the display to be selectively guided. For example, a light-guiding adhesive layer may be used to follow the curvature of a three-dimensional glass window or to increase the perceived area of the display to get edge-to-edge viewing and a reduction of the bezel width.

Figure 6:
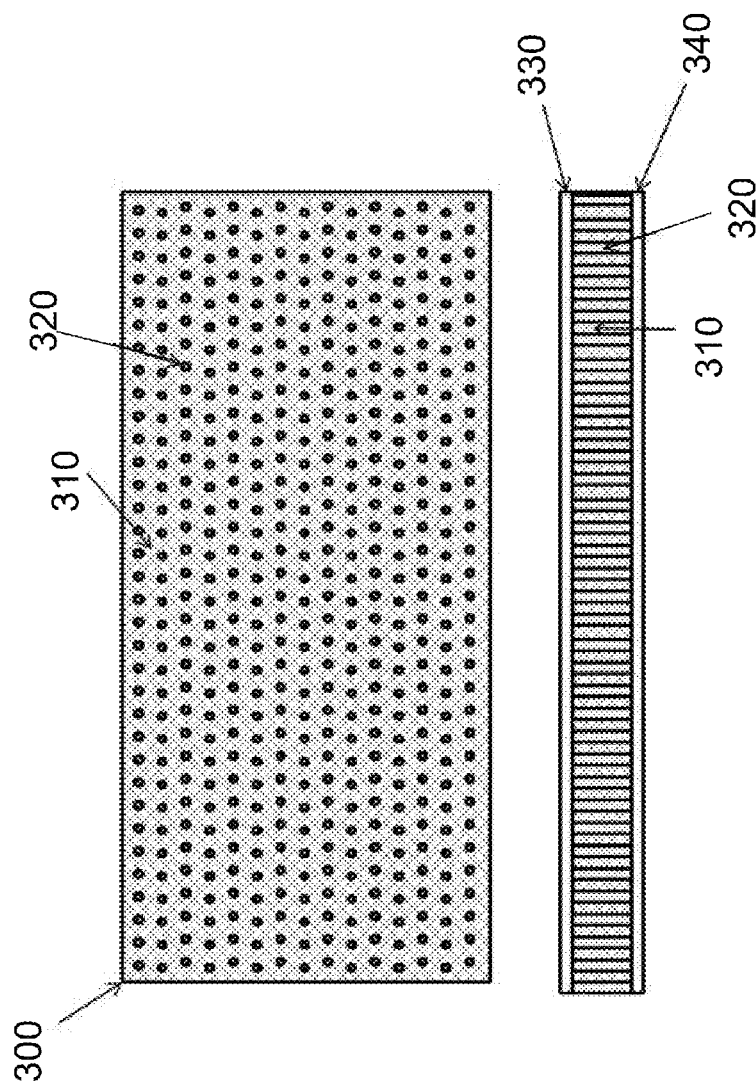
FIG. 6 illustrates an example embodiment of selectively patterned optically clear adhesive having vertically aligned cylindrical regions of higher refractive index according to the present invention.

By selectively cross-linking cylindrical regions within the LOCA, a fiber-optic plate can be created. FIG. 6 illustrates display stack 300 with a bottom substrate 340 and a top substrate 330 including a patterned OCA layer disposed therebetween having vertically aligned cylindrical regions of higher refractive index 320 with diameters of about 1-50 µm, which are surrounded by a region of OCA 310 (or air, non-curing liquid, etc.) having a lower refractive index. Such an embodiment creates a composite OCA layer that behaves like a fiber optic faceplate and can optically guide images from the underlying display to the top of the display window.

Figure 7:
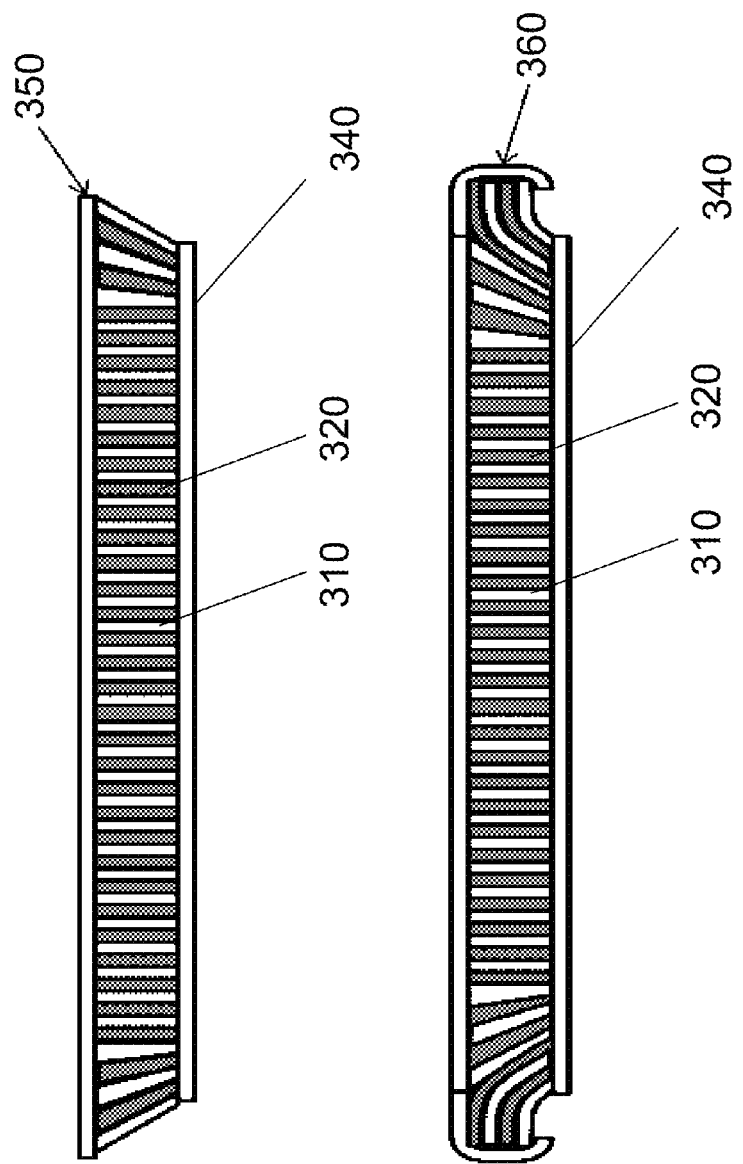
FIG. 7 illustrates a light-guide optically clear adhesive used to channel light from a display to a cover glass according to the present invention.

According to some example embodiments, the composite OCA layer including aligned cylinders regions of OCA with a relatively high refractive index 320 and regions having a relatively lower refractive index 310 may guide images from the display (e.g., substrate 340) to the edges of a larger cover. FIG. 7 illustrates an example embodiment in which a composite OCA layer can guide images from the display substrate 340 to the edges of a larger cover glass substrate 350 to give the impression of an edge-to-edge display with minimal border. In extreme cases, the composite OCA layer can be used to channel images from the display substrate 340 to the edges of a curved glass cover window 360 to give the impression of a wrap-around display.

In one example embodiment, the cylinders of a high refractive index 320 may be formed with a moisture-curable silicone LOCA by sequentially printing water to selected areas and over-coating with LOCA. By repeating the water-printing and LOCA-layering steps while gradually changing the moisture pattern, tilted or curved cylinders may be formed.

In one embodiment, a UV mask with circular apertures may be applied below a first substrate, provided the first substrate is UV radiation permeable. A UV radiation source may be applied from below the substrate while the LOCA is inkjet printed only at circular aperture locations. The inkjet printed LOCA may be cured substantially immediately so that a pillar is gradually formed. The drop location can be slightly shifted as the pillar is grown since the UV radiation is guided through the pillar as it is formed. Bent/curved arrays of pillars can be formed in this manner. As a final operation, a complete overcoat layer of LOCA may be applied and the top substrate laminated. The UV light may again be guided along the pillar to form a cured joint at the top end of the cylindrical pillar to the topmost substrate.

Materials which may be used for flexible substrates according to example embodiments of the present invention may include Polyethylene 2,6-naphthalate (PEN). Polyethylene Terephthalate (PET), Polyimide (PI), Polycarbonate (PC), Polyethylene (PE), Polyurethane (PU), Polymethylmethacrylate (PMMA), Polystyrene (PS), natural rubbers such as; Polyisoprenes, Polybutadienes, Polychloraprenes, Polyisobutylenes, Nitrile Butadienes and Styrene Butadienes, saturated elastomeric materials such as; Polydimethylsiloxane (PDMS), Silicone rubbers, Fluorosilicone rubbers, Fluoroelastomers, Perfluoroelastomers, Ethylene Vinyl Acetate (EVA) Thermoplastic Elastomers such as Styrene Block copolymers, Thermoplastic polyolefins, Thermoplastic vulcanisates, Thermoplastic Polyurethane (TPU) Thermoplastic Copolyesters, Melt processable rubbers. Metal foils may also be used, in particular planarised metal foils on which TFTs and displays can be created.

Layers of a flexible display stack may also include flexible displays such as Organic Light Emitting Diodes (OLED), Liquid Crystal (LCD), Polymer Dispersed Liquid Crystal (PDLC) or other reflective LCD display, ElectroPhoretic (EP), Electroluminescent (EL), Electrowetting (EW) Electrochromic (EC), or other optical modulation effects such as Interference based on frustrated internal reflection or Fabry Perot cavities.

In example embodiments in which the flexible display may be touch sensitive, the touch sensitive layer may function based on resistive, optical, or capacitive touch sensing. This touch sensing layer may or may not be included as part of the display layer in the form of in-cell or on-cell touch capability or using optical sensing pixels. Separate touch sensing layers based upon resistive or capacitive touch may include conductive patterns created from transparent conducting metal oxides such as Indium Tin Oxide (ITO), Fluorine doped tin oxide (FTO), Aluminium doped zinc oxide (AlZnO), Poly(2,3-dihydrothieno-1,4-dioxin)-poly(styrenesulfonate) (PEDOT:PSS), Polypyrrole (Ppy), Silver nanowires, Carbon Nanotubes and Graphene based materials including composites thereof Graphene or any other suitable material.

Optically clear adhesives may be made of various materials. Conventional LOCAs may be made of acrylic, polyurethane, methylmethacrylate or silicone-based. In addition to UV and thermal curing, some silicone-based LOCAs are "moisture"-curable (combination of moisture and UV), and others can be cured chemically by addition of a chemical cross-linker which may or may not be catalyzed by a metal. Suitable examples include materials supplied by Henkel such as their 319XX series UV cured Acrylic and Silicone products or 3M's 21xx series of UV cured Acrylic adhesives, Delo's Photobond products and Dymax UV curable adhesives 9008

Figure 8:
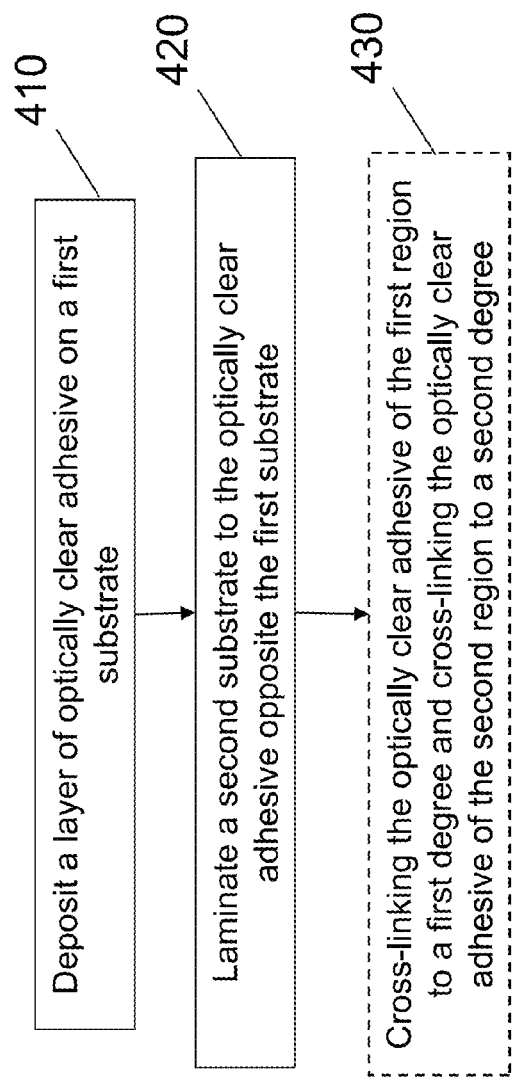
FIG. 8 is a flowchart of an example embodiment of selectively patterning optically clear adhesives according to the present invention.

FIG. 8 is a flowchart of techniques according to example embodiments of the invention. It will be understood that each block of the flowchart, and combinations of blocks in the flowchart, may be implemented by various means. Accordingly, blocks of the flowcharts support combinations of means for performing the specified functions and combinations of operations for performing the specified functions. It will also be understood that one or more blocks of the flowcharts, and combinations of blocks in the flowcharts, can be implemented by special purpose hardware-based computer systems which perform the specified functions, or combinations of special purpose hardware and computer instructions.

In this regard, a method according to one embodiment of the invention, as shown in FIG. 8, may include depositing a layer of optically clear adhesive on a first substrate at 410. The optically clear adhesive may be deposited by any of the means outlined above, including ink-jet printing, screen printing, slot-coating, bar-coating, micro-gravure printing, etc. A second substrate may be laminated to the optically clear adhesive at 420. The optically clear adhesive may include a first region with a first elastic modulus, and a second region with a second elastic modulus. The first elastic modulus may be higher (stiffer) than the second elastic modulus.

In some embodiments, certain ones of the operations above may be modified or further amplified as described below. Moreover, in some embodiments additional optional operations may also be included. It should be appreciated that each of the modifications, optional additions or amplifications below may be included with the operations above either alone or in combination with any others among the features described herein. In some embodiments, the optically clear adhesive of the first region may be cross-linked to a first degree, such as by curing through exposure to UV radiation or heat. The second region may be cross-linked to a different degree, if at all, at 430.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe some example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A method comprising:
    depositing a layer of optically clear adhesive on a first substrate; and
    laminating a second substrate to the optically clear adhesive opposite the first substrate;
    wherein a first region of the optically clear adhesive comprises a first elastic modulus,
    wherein a second region of the optically clear adhesive, exclusive of the first region, comprises a second elastic modulus, and
    wherein the first elastic modulus is different from the second elastic modulus.

2. The method of claim 1, wherein the optically clear adhesive comprises a liquid optically clear adhesive or a thin film optically clear adhesive.

3. The method of claim 2, further comprising cross-linking the optically clear adhesive of the first region to a first degree and cross-linking the optically clear adhesive of the second region to a second degree, which is different than the first degree.

4. The method of claim 3, wherein the cross-linking of the optically clear adhesive is performed by exposure to ultraviolet radiation.

5. The method of claim 4, wherein the second region of the optically clear adhesive is shielded from at least a portion of the ultraviolet radiation.

6. The method of claim 3, wherein the cross-linking of the optically clear adhesive is performed by application of heat.

7. The method of claim 3, wherein the cross-linking of the optically clear adhesive is performed by application of a chemical cross linker.

8. The method of claim 1, wherein depositing a layer of optically clear adhesive comprises printing a pattern of a first optically clear adhesive to form the first region of the optically clear adhesive.

9. The method of claim 8, wherein depositing a layer of optically clear adhesive further comprises printing a second pattern of a second optically clear adhesive to form the second region of the optically clear adhesive.

10. The method of claim 8, further comprising wicking a second optically clear adhesive into gaps formed between the first optically clear adhesive to form the second region of optically clear adhesive.

11. The method of claim 1, wherein the second elastic modulus is lower than the first elastic modulus, and wherein the second region of the optically clear adhesive defines a region of increased flexibility.

12. An apparatus comprising:
    a display stack comprising:
        a first substrate;
        a layer of optically clear adhesive deposited on the first substrate; and a second substrate;

wherein the layer of optically clear adhesive defines a first region with a first elastic modulus, wherein the layer of optically clear adhesive defines a second region with a second elastic modulus, and wherein the first elastic modulus is different from the second elastic modulus.

13. The apparatus of claim 12, wherein the second elastic modulus is lower than the first elastic modulus, and wherein the second region of the optically clear adhesive defines a region of the display stack with greater flexibility than a region of the display stack defined by the first region of the optically clear adhesive.

14. The apparatus of claim 12, wherein the optically clear adhesive comprises a liquid optically clear adhesive.

15. The apparatus of claim 14, wherein the liquid optically clear adhesive is cross-linked to a first degree in the first region, and cross-linked to a second degree that is different from the first degree in the second region.

16. The apparatus of claim 12, wherein the first region of optically clear adhesive is cured in response to exposure to ultraviolet radiation.

17. An apparatus comprising:
a display stack comprising:
a first substrate;
a layer of optically clear adhesive deposited on the first substrate; and
a second substrate;
wherein the layer of optically clear adhesive defines a first patterned region with a first refractive index,
wherein the layer of optically clear adhesive defines a second patterned region with a second refractive index, and
wherein the first refractive index is different from the second refractive index.

18. The apparatus of claim 17, wherein the first patterned region and the second patterned region comprise the same optically clear adhesive, and wherein the first patterned region is cured to a first degree, and wherein the second patterned region is cured to a second degree, different than the first degree.

19. The apparatus of claim 18, wherein the first patterned region is cured by exposure to ultraviolet radiation.

20. The apparatus of claim 17, wherein the first patterned region and the second patterned region each comprise a different optically clear adhesive.

* * * * *